United States Patent [19]

Higashi et al.

[11] Patent Number: 5,629,136
[45] Date of Patent: May 13, 1997

[54] PHOTOSENSITIVE LITHOGRAPHIC PRINTING PLATE REQUIRING NO FOUNTAIN SOLUTION

[75] Inventors: Tatsuji Higashi; Koji Sonokawa; Tsumoru Hirano, all of Shizuoka, Japan

[73] Assignee: Fuji Photo Film Co., Ltd., Minami-ashigara, Japan

[21] Appl. No.: 568,372

[22] Filed: Dec. 6, 1995

[30] Foreign Application Priority Data

Dec. 9, 1994 [JP] Japan .................... 6-306568

[51] Int. Cl.$^6$ .................... G03F 7/11
[52] U.S. Cl. .................... 430/272.1; 430/303
[58] Field of Search .................... 430/303, 272.1

[56] References Cited

U.S. PATENT DOCUMENTS

| | | | |
|---|---|---|---|
| 5,061,598 | 10/1991 | Abe et al. | 430/272.1 |
| 5,069,999 | 12/1991 | Higashi et al. | 430/272.1 |
| 5,266,443 | 11/1993 | Higashi et al. | 430/272.1 |

FOREIGN PATENT DOCUMENTS

| | | | |
|---|---|---|---|
| 6-83045 | 3/1994 | Japan . | |
| 6-83045A | 3/1994 | Japan | 430/272.1 |

*Primary Examiner*—Cynthia Hamilton

*Attorney, Agent, or Firm*—Burns, Doane, Swecker & Mathis, LLP

[57] ABSTRACT

A presensitized plate for use in making a lithographic printing plate requiring no fountain solution excellent in scratch resistance and press life is disclosed, which comprises support and, formed thereon in order from support, a photosensitive layer and a silicone rubber layer, wherein the silicone rubber layer is a crosslinked and cured product obtained by addition reaction of (a) polysiloxane having alkenyl groups with (b) hydrogen polysiloxane having ≡Si—H groups so that the number of ≡Si—H groups in (b) is from 11 to 30 based on the number of alkenyl groups in (a), wherein polysiloxane (a) has at least two alkenyl groups directly bonded to silicon atoms per molecule, average repeating number x of —[Si($R^1$)($R^2$)—O]$_x$— group of $100 \leq x \leq 600$ (wherein $R^1$ and $R^2$ each represents a alkyl group, aryl group, aralkyl group, alkenyl group, polydimethylsiloxane group or halogenated hydrocarbon group, provided that 70% or more of $R^1$ and $R^2$ are methyl groups), and alkyl groups or alkenyl groups directly bonded to the terminal silicon atoms, and wherein the hydrogen polysiloxane (b) is formula (I):

$$R^3-Si(R^4)_2-O-[SiH(R^4)-O]_y-[Si(R^4)_2-O]_z-Si(R^4)_2-R^3 \quad (I)$$

wherein $R^3$ represents a hydrogen atom or a methyl group; $R^4$ represents an alkyl group, an aryl group, or an aralkyl group, provided that 70% or more of $R^4$ is a methyl group; y is from 4 to 100, and z is from 0 to 100.

1 Claim, No Drawings

PHOTOSENSITIVE LITHOGRAPHIC PRINTING PLATE REQUIRING NO FOUNTAIN SOLUTION

FIELD OF THE INVENTION

The present invention relates to a presensitized plate for use in making a lithographic printing plate requiring no fountain solution which is excellent in scratch resistance and press life.

BACKGROUND OF THE INVENTION

Various presensitized plate for use in making a lithographic printing plates requiring no fountain solution (hereinafter referred to as "waterless lithographic printing plate") for lithographic printing without using fountain solution have been proposed. Above all, those disclosed in JP-B-54-26923 (the term "JP-B" as used herein refers to an "examined Japanese patent publication"), JP-B-55-22781, JP-B-56-23150 and JP-A-2-236550 (the term "JP-A" as used herein refers to a "published unexamined Japanese patent application") comprising a primer layer, a photosensitive layer and a silicone rubber layer formed in this order on a support have extremely high performances.

These silicone rubber layers used for waterless lithographic printing plate function as an ink-repellent layer and, in general, high polymers comprising polysiloxane as a main skeleton partially crosslinked by a crosslinking agent are used as silicone rubber layers. In general, the following two methods are used as the curing method of silicone rubber layers:

(1) Condensation type: a method of making silicone rubber by crosslinking polysiloxane having hydroxyl groups at both terminals with silane or siloxane having a hydrolyzable functional group directly bonded to a silicon atom.

(2) Addition type: a method of making silicone rubber by addition reacting polysiloxane having an ≡SiH group with polysiloxane having a —CH=CH— group (these methods are disclosed in JP-A-61-73156, JP-A-2-226246, JP-A-2-236550, JP-A-3-161753, JP-A-4-68353, JP-A-4-174437, JP-A-6-83045 and JP-A-4-239576).

The condensation type silicone rubbers in the above (1) have a disadvantage in that the curability thereof and adhesion to the photosensitive layer fluctuate according to the water content in the atmosphere during curing and as a result, when the condensation type silicone rubbers are used for the preparation of the waterless lithographic printing plates, it is difficult to produce the printing plates stably due to the fluctuation of sensitivity. Accordingly, the addition type silicone rubbers in (2) above having no such a drawback are thought to be superior.

These waterless lithographic printing plates are very liable to be scratched because the surface layer is a silicone rubber layer and they must be handled very carefully after development compared with the general lithographic printing plate comprising the photosensitive layer formed on an aluminum support. When the silicone rubber layer is scratched, the scratch can be retouched by coating a correction liquid if it is a non-image area, but plate making must be made over again if an image area is scratched. Further, waterless lithographic printing plates have a drawback of being inferior in impression capacity compared with the general lithographic printing plates. For example, the plate surface is scratched during printing or the adhesion between the silicone rubber layer and the photosensitive layer is not sufficient and the silicone rubber layer peels off partially during printing leading to printing failure, and an improvement has been accordingly strongly desired.

SUMMARY OF THE INVENTION

One object of the present invention is to provide a waterless lithographic printing plate which is remarkably excellent in scratch resistance and press life.

The above object of the present invention has been attained by a presensitized plate for use in making a lithographic printing plate requiring no fountain solution shown below.

A presensitized plate for use in making a lithographic printing plate requiring no fountain solution, which comprises a support and, formed thereon in the order from the support, a photosensitive layer and a silicone rubber layer, wherein said silicone rubber layer is a crosslinked and cured product obtained by addition reaction of compounding (a) polysiloxane having alkenyl groups with (b) hydrogen polysiloxane having ≡Si—H groups so that the number of ≡Si—H groups in (b) is from 11 to 30 based on the number of alkenyl groups in (a), wherein said polysiloxane (a) has at least two alkenyl groups directly bonded to silicon atoms per molecule, average repeating number x of an —[Si($R^1$)($R^2$)—O]$_x$— group of $100 \leq x \leq 600$ (wherein $R^1$ and $R^2$ each represents a substituted or unsubstituted alkyl group, a substituted or unsubstituted aryl group, a substituted or unsubstituted aralkyl group, a substituted or unsubstituted alkenyl group, a substituted or unsubstituted polydimethylsiloxane group or a substituted or unsubstituted halogenated hydrocarbon group, provided that 70% or more of $R^1$ and $R^2$ are methyl groups), and substituted or unsubstituted alkyl groups or substituted or unsubstituted alkenyl groups directly bonded to the terminal silicon atoms, and wherein said hydrogen polysiloxane (b) is represented by formula (I):

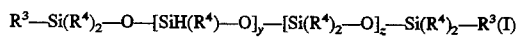

$$R^3—Si(R^4)_2—O—[SiH(R^4)—O]_y—[Si(R^4)_2—O]_z—Si(R^4)_2—R^3 \quad (I)$$

wherein $R^3$ represents a hydrogen atom or a methyl group; $R^4$ represents an alkyl group, an aryl group, or an aralkyl group, and $R^4$'s may be the same or different, provided that 70% or more of $R^4$ is a methyl group; y is from 4 to 100, and z is from 0 to 100.

Addition type silicone rubber is obtained, as described above, by reacting alkenyl groups, a base polymer, in component (a) with Si—H groups, a crosslinking agent, in component (b). It has been found that when the number of Si—H groups in (b) is from 11 to 30 based on the number of alkenyl groups in (a), although the reason is unknown, the adhesion of the silicone rubber layer and the photosensitive layer in unexposed state becomes strong and when imagewise exposed, the adhesion between the silicone rubber layer and the photosensitive layer increases, as a result, scratch resistance and press life are improved.

DETAILED DESCRIPTION OF THE INVENTION

The present invention is described in detail below.

The waterless lithographic printing plate of the present invention should have flexibility so as to be set on an ordinary lithographic printing machine and, at the same time, have durability so as to withstand load during printing. Accordingly, representative examples of substrates include coat paper, a metal plate such as aluminum, a plastic film such as polyethylene terephthalate, rubber, or composites of them. The substrate may be subjected to various surface treatments for purposes of whitening the surface of the substrate, erasing rolling grains and preventing halation. A primer layer may further be coated on the surface of the substrate for preventing halation or other purposes.

Further, as disclosed in JP-A-4-3166, the surface of the substrate may be surface-treated with a silane coupling agent to improve the adhesion between the substrate and the photosensitive layer or a primer layer.

Various layers can be used as the primer layer for improving the adhesion between the substrate and the photosensitive resin layer, preventing halation, or improving image dyeing and printing properties. Examples of primer layers include, for example, a layer formed by exposing and curing any of various photosensitive polymers disclosed in JP-A-60-22903 prior to the lamination of a photosensitive resin layer on the primer layer; a layer formed by heat curing the epoxy resin disclosed in JP-A-62-50760; a layer formed by curing the gelatin disclosed in JP-A-63-133151; a layer comprising the urethane resin and the silane coupling agent disclosed in JP-A-3-200965; and a layer comprising the urethane resin disclosed in JP-A-3-273248. In addition to the above, a layer formed by curing casein is also useful. Further, in order to obtain a flexible primer layer, a polymer having a glass transition temperature of not higher than room temperature may be incorporated into the above primer layers, such as a polyurethane, a polyamide, a styrene/butadiene rubber, a carboxy modified styrene/butadiene rubber, an acrylonitrile/butadiene rubber, a carboxy modified acrylonitrile/butadiene rubber, a polyisoprene, an acrylate rubber, a polyethylene, a chlorinated polyethylene, or a chlorinated polypropylene. These polymers may be added in any proportion as desired, therefore, a primer layer may be formed with such an additive polymer only as long as film formation is possible.

For the above described purposes, additives may be incorporated into these primer layers such as a dye, a pH indicator, a printing out agent, a photopolymerization initiator, an adhesion aid (e.g., polymerizable monomers, diazo resins, silane coupling agents, titanate coupling agents, and aluminum coupling agents), a pigment, and a silica powder. In general, the coating amount of the primer layer is desirably from 0.1 to 20 g/m$^2$, preferably from 1 to 10 g/m$^2$, by weight.

Examples of the photosensitive layers for use in the present invention include a photopolymerizable photosensitive layer, a photocrosslinkable photosensitive layer, and a photosensitive layer comprising a diazo resin and a binder resin.

The photopolymerizable photosensitive layer comprises at least (1) a monomer, oligomer or macromonomer having at least one photopolymerizable ethylenically unsaturated group, (2) a polymeric compound having a film forming ability, and (3) a photopolymerization initiator.

COMPONENT (1)

Monomer, Oligomer or Macromonomer Having at Least One Photopolymerizable Ethylenically Unsaturated Group Examples of the monomer, oligomer or macromonomer which can be used in the present invention include the following.

(A) Acrylic or methacrylic esters of alcohols (e.g., ethanol, propanol, hexanol, 2-ethylhexanol, cyclohexanol, glycerol, hexanediol, trimethylolpropane, pentaerythritol, sorbitol, triethylene glycol, polyethylene glycol, and polypropylene glycol).

(B) Reaction products of amines (e.g., ethylamine, butylamine, benzylamine, ethylenediamine, hexamethylenediamine, diethylenetriamine, xylylenediamine, ethanolamine, and aniline) with glycidyl acrylate, glycidyl methacrylate or allyl glycidyl ether.

(C) Reaction products of carboxylic acids (e.g., acetic acid, propionic acid, benzoic acid, acrylic acid, methacrylic acid, succinic acid, maleic acid, phthalic acid, tartaric acid, and citric acid) with glycidyl acrylate, glycidyl methacrylate or allyl glycidyl ether.

(D) Amide derivatives (e.g., acrylamide, N-methylolacrylamide, t-butylacrylamide, methylenebisacrylamide, and diacetone acrylamide).

Examples of component (1) further include polyfunctional acrylates and methacrylates such as the urethane acrylates disclosed in JP-B-48-41708, JP-B-50-6034 and JP-A-51-37193, the polyester acrylates disclosed in JP-A-48-64183, JP-B-49-43191 and JP-B-52-30490, and epoxy acrylates obtained by reacting epoxy resins with (meth) acrylic acid, and the N-methylolacrylamide derivatives disclosed in U.S. Pat. No. 4,540,649. Further, the photocurable monomers and oligomers disclosed in *Nihon Setchakuzai Kyokai Shi* (*The Journal of Japan Adhesive Society*), Vol. 20, No. 7, pages 300 to 308 (1984), and the macromonomers disclosed in P. Dreyfuss & R. P. Quirk, *Encycl. Polym. Sci. Eng.*, 7, 551 (1987), *Kagaku Kogyo* (*Chemical Industry*), 38, 56 (1987), and *Kobunshi Kako* (*Polymer Processing*), 35, 262 (1986) can also be used. However, component (1) should not be construed as being limited thereto. For example, the polyfunctional monomers may contain an acrylic group, a methacrylic group, an allyl group, and a vinyl group in admixture as the unsaturated groups. Further, they may be used alone or in combination. Component (1) is used in an amount of from 5 to 80% by weight, preferably from 30 to 70% by weight, based on the total weight of the solid components contained in the photopolymerizable photosensitive layer.

COMPONENT (2)

Polymeric Compound Having Film Forming Ability

Examples of the polymeric compounds having a film forming ability which can be used in the present invention include a polyester resin, a vinyl chloride/vinyl acetate copolymer, an acrylic resin, a vinyl chloride resin, a polyamide resin, an epoxy resin, a (meth)acrylate copolymer, a (meth)acrylamide copolymer, a polyurethane resin, a vinyl acetate copolymer, a polystyrene, a phenoxy resin, a polyvinyl chloride, an acid cellulose derivative, an alcohol-soluble polyamide, a (meth)acrylic acid copolymer, a maleic acid copolymer, a polyvinyl alcohol, a water-soluble polyamide, a water-soluble polyurethane, a water-soluble cellulose, and a polyvinylpyrrolidone.

Further, a polymeric compound having a photopolymerizable or photocrosslinkable olefinically unsaturated double bond group in a side chain can be used as the polymeric compound having a film forming ability. However, component (2) should not be construed as being limited thereto.

COMPONENT (3)

Photopolymerization Initiator

Representative examples of photopolymerization initiators for use in the present invention include the following.

a) Benzophenone derivatives, e.g., benzophenone, Michler's ketone, xanthone, anthrone, thioxanthone, acridone, 2-chloroacridone, 2-chloro-N-n-butylacridone, 2,4-diethylthioxanthone, and fluorenone.

b) Benzoin derivatives, e.g., benzoin, benzoin methyl ether, and benzoin ethyl ether.

c) Quinones, e.g., p-benzoquinone, β-naphthoquinone, and β-methylanthraquinone.

d) Sulfur compounds, e.g., dibenzyl disulfide and di-n-butyl disulfide.

e) Azo or diazo compounds, e.g., 2-azobisisobutyronitrile, 1-azobis-1-cyclohexanecarbonitrile, p-diazobenzylethylaniline, and Congo Red.

f) Halogen compounds, e.g., carbon tetrabromide, silver bromide, α-chloromethylnaphthalene, and trihalomethyl-s-triazine compounds.

g) Peroxides, e.g., benzoyl peroxide.

They may be used alone or in combination. These photopolymerization initiators are used in an amount of from 0.1 to 25% by weight, preferably from 3 to 20% by weight, based on the entire amount of the components of the photosensitive layer.

OTHER COMPONENTS

In addition to the above components, a thermal polymerization inhibitor is preferably added. Useful examples thereof include hydroquinone, p-methoxyphenol, di-t-butyl-p-cresol, pyrogallol, t-butylcatechol, 4,4'-thiobis(3-methyl-6-t-butylphenol), 2,2'-methylenebis(4-methyl-6-t-butylphenol), and 2-mercaptobenzimidazole. In some cases, a dye or a pigment and a printing out agent such as a pH indicator or a leuco dye can be added for the purpose of coloring a photosensitive layer. According to purposes, a photosensitive layer may further contain a small amount of a silicone compound such as a polydimethylsiloxane, a methylstyrene modified polydimethylsiloxane, an olefin modified polydimethylsiloxane, a polyether modified polydimethylsiloxane, a silane coupling agent, a silicon diacrylate, or a silicon dimethacrylate. A silicone surfactant or a fluorine surfactant may be added to the photosensitive layer for improving coating property. Further, a diazo resin may be added to improve the adhesion between the photosensitive layer and the primer layer. Moreover, the plasticizer (e.g., polyethylene glycol and tricresyl phosphate) for imparting flexibility to the coating film disclosed in JP-A-4-328568, the stabilizer (e.g., phosphoric acid), and the sulfonic acid disclosed in Japanese Patent Application No. 6-121359 may be incorporated to the photosensitive layer. These additives are usually added in an amount of 10% by weight or less based on the total weight of the entire components of the photosensitive layer. In some cases, a hydrophobic silica powder treated with a silane coupling agent containing a (meth)acryloyl group or an allyl group may be added in an amount of 50% by weight or less based on the total weight of the entire components of the photosensitive layer.

Further, as diazo resins for use in a photosensitive layer comprising a diazo resin and a binder resin, etc., examples include condensation products of aromatic diazonium salts with formaldehyde. Particularly preferred are inorganic salts of diazo resins which are the reaction products of the salt of condensation products of p-diazodiphenylamine with formaldehyde or acetaldehyde, e.g., hexafluorophosphate, tetrafluoroborate, perchlorate or periodate, with the above condensation products, and the organic salts of the diazo resins which are the reaction products of the above condensation products with the sulfonic acids as disclosed in U.S. Pat. No. 3,200,309. The proportion of the diazo resin of the present invention in the photosensitive layer is from 20 to 95% by weight, preferably from 35 to 80% by weight.

Various polymeric compounds can be used as the binder resin, but preferred examples include copolymers of a monomer having an aromatic hydroxyl group such as N-(4-hydroxyphenyl)acrylamide, N-(4-hydroxyphenyl)methacrylamide, o-, m- or p-hydroxystyrene, or o-, m- or p-hydroxyphenyl methacrylate with other monomers, such as those disclosed in JP-A-54-98613, polymers having hydroxyethyl (meth)acrylate units as a main repeating unit, such as those disclosed in U.S. Pat. No. 4,123,276, copolymer resins containing monomer units having a phenolic hydroxyl group and monomer units having an alcoholic hydroxyl group, such as those disclosed in JP-A-3-158853, natural resins such as shellac and rosin, polyvinyl alcohol, polyamide resins such as those disclosed in U.S. Pat. No. 3,751,257, linear polyurethane resins such as those disclosed in U.S. Pat. No. 3,660,097, phthalated polyvinyl alcohol resins, epoxy resins produced by condensation of bisphenol A and epichlorohydrin, and cellulose such as cellulose butyrate and cellulose acetate.

Moreover, the resins mainly comprising photosensitive polymers such as polyesters, polyamides, or polycarbonates each of which contains —CH=CH—CO— as a photosensitive group in the backbone or in the side chain of the polymer can also be used. Examples of such resins include a photosensitive polyester obtained by condensation of phenylenediethyl acrylate with hydrogenated bisphenol A and triethylene glycol, such as those disclosed in JP-A-55-40415, and photosensitive polyesters derived from (2-propenylidene)malonic acid compounds such as cinnamylidenemalonic acids and bifunctional glycols, such as those disclosed in U.S. Pat. No. 2,956,878.

Additives such as a dye, a surfactant, a plasticizer or a stabilizer can also be added to the photosensitive layer using the above diazo resins.

The above described compositions for the photosensitive layer for use in the present invention are dissolved in an appropriate single or mixed solvent such as 2-methoxyethanol, 2-methoxyethyl acetate, propylene glycol methylethyl acetate, methyl lactate, ethyl lactate, propylene glycol monomethyl ether, ethanol, methyl ethyl ketone, or N,N-dimethylacetamide, and coated on a substrate. The coating weight thereof is desirably from 0.1 to 20 g/m$^2$, preferably from 0.5 to 10 g/m$^2$, on a dry basis.

The silicone rubber layer for use in the present invention comprises the following components.

(a) Polysiloxane, as a base polymer, having at least two alkenyl groups (e.g., a vinyl group, a butenyl group, a hexenyl group, a decenyl group, etc., more preferably a vinyl group) directly bonded to silicon atoms per molecule, and the average repeating number x of the —[Si(R$^1$)(R$^2$)—O]$_x$— group of the polysiloxane is $100 \leq x \leq 600$, preferably $150 \leq x \leq 500$, (wherein R$^1$ and R$^2$ each represents an alkyl group, such as a methyl group or an ethyl group, a (meth)acryloyl group-substituted or polydimethylsiloxane group-substituted alkyl group, a substituted or unsubstituted alkenyl group, a polydimethylsiloxane group, an aryl group such as a phenyl group, an aralkyl group such as a β-phenylpropyl group, or a halogenated hydrocarbon group such as a chloromethyl group, and a 3,3,3-trifluoropropyl group, provided that 70% or more of R$^1$ and R$^2$ are methyl groups). This polysiloxane may be used alone or two or more base polymers may be used in admixture. When x is less than 100, physical properties of rubber as the silicone rubber such as scratch resistance and press life are deteriorated and when x exceeds 600, modulus of elasticity of the silicone rubber is lower and scratch resistance and press life are deteriorated, it is presumably because the distance between the crosslinked points becomes long. When the methyl groups of $R^1$ and $R^2$ are less than 70%, ink repellency is reduced. Specific examples of the compounds belonging to (a) are shown below, but the present invention should not be construed as being limited thereto.

Compound A $$CH_2=CH-Si(CH_3)_2-O-[Si(CH_3)_2-O]_x-Si(CH_3)_2-CH=CH_2$$

x=160

Compound B

Average repeating number x of Compound A: 260

Compound C

Average repeating number x of Compound A: 500

Compound D $$(CH_2=CH)_3-SiO-[Si(CH_3)_2-O]_{500}-Si-(CH=CH_2)_3$$

Compound E $$CH_2=CH-Si(CH_3)_2-O-[Si(CH_3)_2-O]_a-[Si(CH_3)(CH=CH_2)-O]_b-Si(CH_3)_2(CH=CH_2)$$

(a/b=259/1, a+b=260)

Compound F

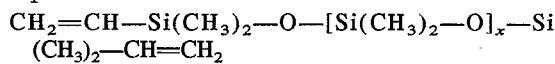

(a/b = 200/1, a + b = 201)

Compound G

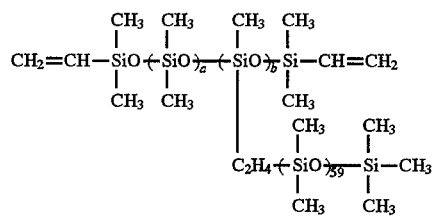

(a/b = 257/3, a + b = 260)

Compound H $$CH_2=CH-Si(CH_3)_2-O-[Si(CH_3)_2-O]_a-[Si(CH_3)(C_2H_4-CF_3)-O]_b-Si(CH_3)_2(CH=CH_2)$$

(a/b=257/3, a+b=260)

Compound I $$CH_2=CH-Si(CH_3)_2-O-[Si(CH_3)_2-O]_a-[Si(C_2H_5)_2-O]_b-Si(CH_3)_2(CH=CH_2)$$

(a/b=250/10, a+b=260)

Compound J

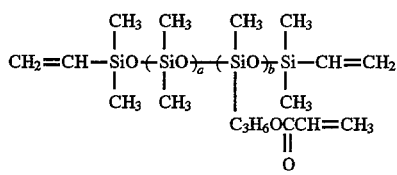

(a/b = 259/1, a + b = 260)

Compound K

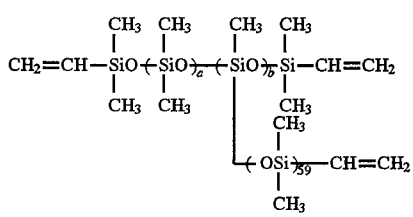

(a/b = 200/1, a + b = 201)

Compound L

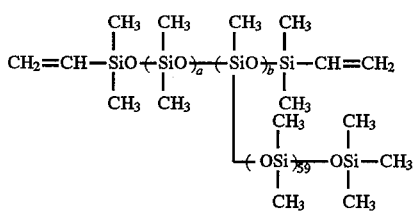

(a/b = 200/1, a + b = 201)

(b) Hydrogen polysiloxane, a crosslinking agent, represented by the above formula (I).

Of the hydrogen polysiloxane for use in the present invention, preferred are hydrogen polysiloxane represented by the following formula (II).

$$(CH_3)_3-Si-O-[SiH(CH_3)-O]_y-[Si(CH_3)_2-O]_z-Si(CH_3)_3 \quad (II)$$

Preferred proportions of y and z in formula (II) are as follows.

| Compound | | |
|---|---|---|
| Compound a | y = 5 | z = 0 |
| Compound b | y = 10 | z = 0 |
| Compound c | y = 20 | z = 0 |
| Compound d | y = 50 | z = 0 |
| Compound e | y = 100 | z = 0 |
| Compound f | y = 5 | z = 5 |
| Compound g | y = 20 | z = 20 |
| Compound h | y = 50 | z = 50 |
| Compound i | y = 100 | z = 100 |

Other preferred hydrogen polysiloxanes are those represented by the following formula (III).

$$HSi(CH_3)_2O-[SiH(CH_3)-O]_y-[Si(CH_3)_2-O]_z-SiH(CH_3)_2 \quad (III)$$

Preferred proportions of y and z in formula (III) are as follows.

| Compound j | y = 18 | z = 0 |
| Compound k | y = 48 | z = 0 |
| Compound l | y = 18 | z = 20 |
| Compound m | y = 48 | z = 50 |

However, the present invention is not limited to these compounds. Two or more crosslinking agents may be used in admixture.

In the above polysiloxanes (a) and (b), the alkyl group preferably has 1 to 5 carbon atoms, the aryl group preferably has 6 to 12 carbon atoms, and the aralkyl group preferably has 7 to 15 carbon atoms. Further, the molecular weight of these polysiloxanes (a) and (b) ranges from 7,000 to 70,000 and from 300 to 8,000, respectively.

The above alkenyl polysiloxane (a) and hydrogen polysiloxane (b) are compounded as coating solutions so as to obtain the compounding ratio of the number of Si—H groups of hydrogen polysiloxane (b) of from 11 to 30, preferably from 12 to 20, based on carbon-carbon unsaturated groups of alkenyl polysiloxane (a). If the number of Si—H groups of hydrogen polysiloxane (b) is less than 11, the adhesion of the silicone rubber layer and the photosensitive layer in unexposed state is lower and scratch resistance and press life are deteriorated, and if this value is greater than 30, Si—H groups are excessive, as a result, physical properties of the silicone rubber is lower and scratch resistance and press life are deteriorated.

The addition reaction catalyst as a composition of the silicone rubber may be selected arbitrarily from known catalysts, but platinum based compounds are particularly preferred. Examples thereof include elemental platinum, platinum chloride, chloroplatinic acid, and olefin-coordinated platinum. For the purpose of retarding the curing speed of these compositions, it is possible to add a crosslinking inhibitor such as organopolysiloxane containing a vinyl group, e.g., tetracyclo(methylvinyl)siloxane, an alcohol having a carbon-carbon triple bond, acetone, methyl ethyl ketone, methanol, ethanol, or propylene glycol monomethyl ether.

The addition reaction begins and curing starts when these compositions of the silicone rubber layer are mixed, and the curing speed suddenly increases according to the increase in the reaction temperature. Therefore, for purposes of prolonging the pot life of the coating solution until curing of the compositions of the silicone rubber layer and shortening the curing time on the photosensitive layer, it is preferred that the compositions of the silicone rubber layer are maintained at a high temperature within the range not affecting the properties of the substrate and the photosensitive layer until the compositions are completely cured.

In addition to these compositions, the known adhesive imparting agents such as alkenyltrialkoxysilane, inorganic fine powders such as silica, calcium carbonate or titanium oxide, an adhesive aid such as a silane coupling agent, a titanate coupling agent, or aluminum coupling agent, a silicone oil or a photopolymerization initiator may be incorporated.

The above described compositions of the silicone rubber layer may be dissolved in an appropriate single or mixed solvent such as, for example, a petroleum solvent, Isopar E, Isopar G, Isopar H (Esso Kagaku K.K.), hexane, heptane, toluene or xylene and applied on the substrate.

Further, the silicone compound represented by the following formula (IV) disclosed in JP-A-1-179047 may be added to the silicone rubber layer for the purpose of improvement of peeling of the cover film provided to protect the ink-repellent layer.

$(R^5)_3-SiO-[Si(R^5)_2-O]_p-[Si(R^6)(R^7)-O]_q-Si(R^5)_3$ (IV)

wherein $R^5$ represents an alkyl group having from 1 to 4 carbon atoms, and $R^5$'s may be the same or different; $R^6$ and $R^7$ each represents a (substituted) alkyl group or a (substituted) aromatic group, and $R^6$ and $R^7$ may be the same or different, provided that either one represents a (substituted) aromatic group; and p/q=99/1 to 10/90 (mol ratio). Specific examples include the following compound but the present invention is not limited thereto.

$(CH_3)_3SiO-[Si(CH_3)_2-O]_p-[Si(CH_3)[CH_2CH(CH_3)-C_6H_5]]_q-O-Si(CH_3)_3$ $p/q=75/25$, $Mw$=about $2\times10^4$ Further, the conventionally known mold releasing agents may be used.

When the thickness of the ink-repellent layer of the present invention is too thin, ink repellency is lower and the layer is liable to be scratched, whereas when the thickness is too thick, developability is impaired. Accordingly, the thickness of the ink-repellent layer is preferably from 0.5 to 5 g/m$^2$, more preferably from 1 to 3 g/m$^2$.

In the waterless lithographic printing plate described herein, the ink-repellent layer may be further coated with various ink-repellent layers. Further, an adhesive layer may be formed between the photosensitive layer and the ink-repellent layer for purposes of enhancing adhesion between the photosensitive layer and the ink-repellent layer or preventing the catalyst poisoning caused by the catalyst contained in the composition of the ink-repellent layer.

Further, in order to protect the surface of the ink-repellent layer, a transparent film may be laminated on the ink-repellent layer, such as, for example, polyethylene, polypropylene, polyvinyl chloride, polyvinylidene chloride, polyvinyl alcohol, polyethylene terephthalate, or cellophane. Alternatively, the ink-repellent layer may be coated with a polymer. These protective films may be used after being stretched. Further, these films may be subjected to matting treatment for improving vacuum contact during imagewise exposure in a printing frame.

The waterless lithographic printing plate of the present invention is, after being exposed through a transparent original, developed with a developing solution which can dissolve or swell a part of the photosensitive layer of the image part (unexposed part).

Developing solutions known for use with waterless lithographic printing plates can be used in the present invention, however, water or an aqueous solution comprising water as a major component and a water-soluble organic solvent as a minor component is preferably used. Taking safety and flammability into consideration, the concentration of the water-soluble solvent is preferably less than 40% by weight, and development with water alone is particularly preferred. Examples of the known developing solutions include, for example, mixtures of aliphatic hydrocarbons (e.g., hexane, heptane, "Isopar E, H, G" (manufactured by Esso Kagaku K.K.), gasoline, kerosene), aromatic hydrocarbons (e.g., toluene, xylene), or halogenated hydrocarbons (e.g., trichlene) with the following polar solvents; and polar solvents alone.

Alcohols: methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, and tetraethylene glycol;

Ketones: acetone and methyl ethyl ketone;

Esters: ethyl acetate, methyl lactate, butyl lactate, propylene glycol monomethyl ether acetate, diethylene glycol acetate, and diethyl phthalate;

Others: triethyl phosphate and tricresyl phosphate.

In addition to these, examples of the developing solutions further include mixtures of the above organic solvent based developing solutions with water, solutions obtained by dissolving the above organic solvents into water with the aid of a surfactant, solutions obtained by further adding an alkali (e.g., sodium carbonate, diethanolamine, or sodium hydroxide) to the above solutions, and water alone (e.g., tap water, pure water and distilled water).

It is also possible to add a dye such as Crystal Violet, Victoria Pure Blue or Astrazone Red to a developing solution to dye an image part simultaneously with development.

Development can be conducted by a known method, for example, by rubbing the plate surface with a developing pad containing the developing solution, or by pouring the developing solution on the plate surface and rubbing the surface with a developing brush in water. The temperature of the developing solution is not particularly limited, but is preferably from 10° C. to 50° C. By this development, the ink repellent layer of the developed image part is removed giving an ink receptive part.

The exposed image part of the thus-obtained printing part can be dyed with a dyeing liquid so that the image part can be ascertained for the confirmation of its image-forming ability. In the case where a dye for dyeing the exposed image part is not contained in the developing solution, a treatment with a dyeing liquid is carried out after development. Only the exposed image part of the photosensitive layer can be dyed by lightly rubbing the image part with a soft pad impregnated with a dyeing liquid. By this procedure, it is possible to confirm whether development has been sufficiently conducted to the highlight part. The dyeing liquid which is used is obtained by dissolving or dispersing one or more dyes selected from water-soluble dispersing dyes, acid dyes and basic dyes in one of water, alcohols, ketones, and ethers, or in a mixture of two or more thereof. It is effective to incorporate carboxylic acids, amines, surfactants, dyeing aids, or defoaming agents into the dyeing liquid for improving dyeability.

The printing plate dyed with a dyeing liquid is then preferably washed with water and dried, to thereby inhibit the tackiness of the plate surface and improve the handleability of the printing plate.

When the printing plates thus-treated are stored in a pile, it is preferred to insert interleaving sheets between the printing plates for the protection of the printing plates.

The above various processes such as development and dyeing or the subsequent water washing and drying are preferably carried out using an automatic processor. Preferred automatic processors are disclosed in JP-A-2-220061.

The waterless lithographic printing plate of the present invention is extremely excellent in scratch resistance and press life.

EXAMPLE

The present invention is described in detail below with reference to the examples, but the present invention should not be construed as being limited thereto.

EXAMPLES 1 TO 25 AND COMPARATIVE EXAMPLES 1 TO 3

Primer Layer

JIS A 1050 aluminum plate having a thickness of 0.3 mm which had been degreased by a conventional technique was immersed in a 1% aqueous solution of aminosilane coupling agent KBM603 (manufactured by Shin-Etsu Chemical Industry Co., Ltd.), and dried at room temperature. A primer layer having the following composition was coated on the above aluminum plate in an amount of 4 g/m$^2$ on a dry basis and the coating was dried by heating at 140° C. for 2 minutes.

| | |
|---|---|
| Sanprene IB1700D (manufactured by Sanyo Chemical Industries Ltd.) | 10 parts by weight |
| Hexafluorophosphate of polycondensation product of p-diazodiphenylamine and paraformaldehyde | 0.1 part by weight |
| TiO$_2$ | 0.1 part by weight |
| Defensa MCF323 (manufactured by Dainippon Ink and Chemicals, Inc.) | 0.03 part by weight |
| Propylene glycol methyl ether acetate | 50 parts by weight |
| Methyl lactate | 20 parts by weight |
| Pure water | 1 part by weight |

The thus-coated aluminum plate was then exposed to light in 20 counts using a vacuum exposure device FT261V UDNS ULTRA-PLUS FLIPTOP PLATE MAKER manufactured by Nu Arc Company.

Photosensitive Layer

The above primed aluminum plate was coated with a photopolymerizable photosensitive solution having the following composition in an amount of 4 g/m$^2$ on a dry basis and the coating was dried at 100° C. for 1 minute.

| | |
|---|---|
| Polyurethane resin (isophoronediisocyanate/polyester (adipic acid/1,4-butanediol/2,2-dimethylpropane-1,3-diol)/isophoronediamine) | 1.5 parts by weight |
| A-600 (manufactured by Shin-Nakamura Chemical Co., Ltd.) | 0.5 part by weight |
| Addition product of xylylenediamine/glycidyl methacrylate (1 mol/4 mol) | 1.3 parts by weight |
| Ethyl Michler's ketone | 0.35 part by weight |
| 2-Chlorothioxanthone | 0.10 part by weight |
| Naphthalenesulfonate of Victoria Pure Blue BOH | 0.01 part by weight |
| Defensa MCF323 (manufactured by Dainippon Ink and Chemicals, Inc.) | 0.03 part by weight |
| Methyl ethyl ketone | 10 parts by weight |
| Propylene glycol methyl ether | 25 parts by weight |

Silicone Rubber Layer

A silicone rubber layer having the following composition was coated on the thus-obtained photopolymerizable photosensitive layer in an amount of 2 g/m$^2$ on a dry basis and the coating was dried at 140° C. for 2 minutes.

| | |
|---|---|
| Polysiloxane shown in Table 1 as a base polymer | |
| Hydrogen polysiloxane shown in Table 1 as a crosslinking agent | |

-continued

| | |
|---|---|
| Polydimethylsiloxane (polymerization degree: about 8,000) | 0.5 part by weight |
| Olefin-chloroplatinic acid | 0.2 part by weight |
| Inhibitor (CH≡C—C(CH$_3$)$_2$—O—Si(CH$_3$)$_3$) | 0.3 part by weight |
| Isopar G (manufactured by Esso Kagaku K.K.) | 140 parts by weight |

A one side matted biaxially stretched polypropylene film having a thickness of 9 μm was laminated on the thus-obtained silicone rubber layer in such a manner that the non-matted side of the film came into contact with the silicone rubber layer to thereby obtain the waterless lithographic printing plate of the present invention.

The thus-obtained printing plate was exposed to light in 30 counts using a vacuum exposure device FT261V UDNS ULTRA-PLUS FLIPTOP PLATE MAKER manufactured by Nu Arc Company, then the laminated film was peeled off.

The plate was immersed in water of 35° C. and rubbed therein with a developing pad to remove the silicone rubber layer in the unexposed part. Subsequently, the plate was dyed with a dyeing liquid having the following composition. Thus, the waterless lithographic printing plate was obtained.

Dyeing Liquid

| | |
|---|---|
| Crystal Violet | 0.1 part by weight |
| Diethylene glycol monomethyl ether | 15 parts by weight |
| Pure water | 85 parts by weight |

Subsequently, before printing, scratch test of the non-image part was conducted by scratching the plate with a sapphire needle of a diameter of 0.5 mm (HEIDON-14 scratch tester, load: 100 g to 500 g). The thus-scratched plate was set on a Hidelberger GTO press from which the dampening device had been removed, and 100,000 sheets of paper were printed using TOYO KING ULTRA TUK Aqualess G Chinese (black) ink manufactured by Toyo Ink Co. to evaluate the load of scratch until the scratch on the non-image part began to appear on the printed matter (scratch resistance), and the number of printed sheets before printed matter began to be smeared due to the breakage of the non-image part of the silicone rubber layer (press life).

The results obtained are shown in Table 1.

TABLE 1

| | Component (a) Base Polymer | | Component (b) Crosslinking agent | | Ratio of Si—H Group Number to Alkenyl Group Number | Scratch Resistance (g) | Press Life (sheet) |
|---|---|---|---|---|---|---|---|
| Example No. | Compound | Amount Added (part by weight) | Compound | Amount added (part by weight) | | | |
| Example 1 | A | 9.0 | a | 1.800 | 13.00 | 500 | >100,000 |
| Example 2 | B | 9.0 | a | 1.114 | 13.00 | 500 | >100,000 |
| Example 3 | C | 9.0 | a | 0.582 | 13.00 | 500 | >100,000 |
| Example 4 | D | 9.0 | a | 1.743 | 13.00 | 450 | 100,000 |
| Example 5 | E | 9.0 | a | 1.669 | 13.00 | 500 | >100,000 |
| Example 6 | F | 9.0 | a | 1.108 | 13.00 | 450 | 100,000 |
| Example 7 | G | 9.0 | a | 1.096 | 13.00 | 450 | 100,000 |
| Example 8 | H | 9.0 | a | 1.099 | 13.00 | 450 | 100,000 |
| Example 9 | I | 9.0 | a | 1.097 | 13.00 | 450 | 100,000 |
| Example 10 | B | 9.0 | b | 0.919 | 13.00 | 500 | >100,000 |
| Example 11 | B | 9.0 | c | 0.821 | 13.00 | 500 | >100,000 |
| Example 12 | B | 9.0 | d | 0.762 | 13.00 | 450 | 100,000 |
| Example 13 | B | 9.0 | e | 0.743 | 13.00 | 450 | 100,000 |
| Example 14 | B | 9.0 | f | 2.007 | 13.00 | 500 | >100,000 |
| Example 15 | B | 9.0 | g | 1.713 | 13.00 | 500 | >100,000 |
| Example 16 | B | 9.0 | h | 1.655 | 13.00 | 450 | 100,000 |
| Example 17 | B | 9.0 | i | 1.635 | 13.00 | 450 | 100,000 |
| Example 18 | B | 9.0 | j | 0.732 | 13.00 | 500 | >100,000 |
| Example 19 | B | 9.0 | k | 0.727 | 13.00 | 450 | 100,000 |
| Example 20 | B | 9.0 | l | 1.624 | 13.00 | 500 | >100,000 |
| Example 21 | B | 9.0 | m | 1.619 | 13.00 | 450 | 100,000 |
| Example 22 | B | 9.0 | b | 0.800 | 11.32 | 450 | 100,000 |
| Example 23 | B | 9.0 | b | 1.300 | 18.39 | 500 | >100,000 |
| Example 24 | B | 9.0 | b | 1.700 | 24.05 | 450 | 100,000 |
| Example 25 | B | 9.0 | b | 2.000 | 28.29 | 450 | 100,000 |
| Comparative Example 1 | B | 9.0 | b | 0.700 | 9.90 | 200 | 70,000 |
| Comparative Example 2 | B | 9.0 | b | 2.200 | 31.12 | 100 | 50,000 |
| Comparative Example 3 | C | 8.0 | n | 0.400 | 10.63 | 300 | 80,000 |
| | M | 1.0 | | | | | |

Compound M: Average repeating number x of Compound A = 700
Compound n: y is 8 and z is 0 in formula (II)

COMPARATIVE EXAMPLE 4

A waterless lithographic printing plate was prepared in the same manner as in Example 1 except for replacing the composition of the silicone rubber layer with the composition shown below (disclosed in JP-A-61-73156). Evaluation was conducted in the same manner.

| | |
|---|---|
| α, ω-Divinylpolydimethylsiloxane (number-average molecular weight: about 12,000, the same as Compound A) | 100 parts by weight |
| α, ω-Dimethylpolymethyl hydrogen siloxane (number-average polymerization degree: 10, the same as compound b) | 3 parts by weight |
| Chloroplatinic acid | 0.1 part by weight |

An n-heptane solution of the above composition was coated on a substrate and heated at 100° C., 10% RH for 5 minutes, dried, then cured to thereby form a silicone rubber layer having a thickness of 3 μm. (In this case, the ratio of the number of Si—H group to that of vinyl group was 2.36.)

Scratch resistance was 100 g and press life was 30,000 sheets.

COMPARATIVE EXAMPLE 5

A waterless lithographic printing plate was prepared in the same manner as in Example 1 except for replacing the base polymer and crosslinking agent of the silicone rubber layer with the following compounds disclosed in JP-A-2-226249, JP-A-2-236550, JP-A-3-161753 and JP-A-2-235064. Evaluation was conducted similarly.

| | |
|---|---|
| Base polymer (average repeating number x of Compound A = 700, the same as Compound M) | 9 parts by weight |
| Crosslinking agent 1 (y is 10 and z is 30 in formula (II)) | 1 part by weight |
| Crosslinking agent 2 [—Si(CH₃)(C₃H₆OG)—O—] [—SiH(CH₃)—O—]₃ (G represents a glycidoxy group) | 0.2 part by weight |
| Polydimethylsiloxane (polymerization degree: about 8,000) | 0.5 part by weight |
| Olefin-chloroplatinic acid | 0.2 part by weight |
| Inhibitor (CH≡C—C(CH₃)₂—O—Si(CH₃)₃) | 0.15 part by weight |
| Isopar G (manufactured by Esso Kagaku K.K.) | 140 parts by weight |

(In this case, the ratio of the number of Si—H group to that of vinyl group was 14.58.)

Scratch resistance was 300 g and press life was 80,000 sheets.

While the invention has been described in detail and with reference to specific examples thereof, it will be apparent to one skilled in the art that various changes and modifications can be made therein without departing from the spirit and scope thereof.

What is claimed is:

1. A presensitized plate for use in making a lithographic printing plate requiring no fountain solution, which comprises a support and, formed thereon in the order from the support, a photosensitive layer and a silicone rubber layer, wherein said silicone rubber layer is a crosslinked and cured product obtained by addition reaction consisting essentially of (a) polysiloxane having alkenyl groups with (b) hydrogen polysiloxane having ≡Si—H groups so that the ratio of the total number of ≡Si—H groups in the total amount of (b) relative to the total number of alkenyl groups in the total amount of (a) is from 11 to 30, wherein said polysiloxane (a) has at least two alkenyl groups directly bonded to silicon atoms per molecule, average repeating number x of an —[Si($R^1$)($R^2$)—O]$_x$— group of $100 \leq x \leq 600$ (wherein $R^1$ and $R^2$ each represents a substituted or unsubstituted alkyl group, a substituted or unsubstituted aryl group, a substituted or unsubstituted aralkyl group, a substituted or unsubstituted alkenyl group, a substituted or unsubstituted polydimethylsiloxane group or a substituted or unsubstituted halogenated hydrocarbon group, provided that 70% or more of $R^1$ and $R^2$ are methyl groups), and substituted or unsubstituted alkyl groups or substituted or unsubstituted alkenyl groups directly bonded to the terminal silicon atoms, and wherein said hydrogen polysiloxane (b) is represented by formula (I);

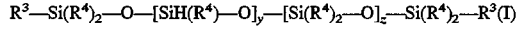

$$R^3-Si(R^4)_2-O-[SiH(R^4)-O]_y-[Si(R^4)_2-O]_z-Si(R^4)_2-R^3 \quad (I)$$

wherein $R^3$ represents a hydrogen atom or a methyl group; $R^4$ represents and alkyl group, an aryl group, or an aralkyl group, and $R^4$'s may be the same or different, provided that 70% or more of $R^4$ is a methyl group; y is from 4 to 100, and z is from 0 to 100.

* * * * *